United States Patent
Zhang et al.

(10) Patent No.: US 10,586,590 B2
(45) Date of Patent: Mar. 10, 2020

(54) SIGNAL PROCESSING CIRCUIT

(71) Applicant: Huawei Technologies Co., Ltd., Shenzhen (CN)

(72) Inventors: Yide Zhang, Wuhan (CN); Zhigang Zeng, Wuhan (CN); Yidong Zhu, Wuhan (CN); Mingfu Cao, Shenzhen (CN); Junfeng Zhao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/822,850

(22) Filed: Nov. 27, 2017

(65) Prior Publication Data
US 2018/0082738 A1 Mar. 22, 2018

Related U.S. Application Data

(63) Continuation of application No. PCT/CN2015/080610, filed on Jun. 2, 2015.

(51) Int. Cl.
*G11C 11/00* (2006.01)
*G11C 13/00* (2006.01)
*G11C 8/16* (2006.01)

(52) U.S. Cl.
CPC ............ *G11C 13/0002* (2013.01); *G11C 8/16* (2013.01); *G11C 13/003* (2013.01); *G11C 13/004* (2013.01); *G11C 13/0028* (2013.01); *G11C 13/0061* (2013.01); *G11C 13/0069* (2013.01); *G11C 2013/0073* (2013.01); *G11C 2213/74* (2013.01); *G11C 2213/79* (2013.01)

(58) Field of Classification Search
CPC .................................................. G11C 13/0069

USPC ......................................................... 365/148
See application file for complete search history.

(56) References Cited

U.S. PATENT DOCUMENTS 9,514,814 B1 * 12/2016 Sandhu .................. G11C 11/56
2009/0059651 A1 * 3/2009 Aoki .................. G11C 13/0007
365/148

(Continued)

FOREIGN PATENT DOCUMENTS

| CN | 101783170 A | 7/2010 |
| CN | 101789262 A | 7/2010 |

(Continued)

OTHER PUBLICATIONS

Janusz, A., et al., "Memristor Crossbar Architecture for Synchronous Neural Networks," IEEE Transactions on Circuits and Systems—I: Regular Papers, vol. 61, No. 8, Aug. 2014, pp. 2390-2401.

(Continued)

*Primary Examiner* — Min Huang
(74) *Attorney, Agent, or Firm* — Conley Rose, P.C.

(57) ABSTRACT

A circuit, where a first end of a resistive random access memory (RRAM) included in the circuit includes a first end of the circuit, and a second end of the RRAM is coupled to a first end of a first switch and a first end of a second switch, a second end of the first switch includes a second end of the circuit, and a first control end of the first switch and a second control end of the second switch are configured to make the first switch closed and the second switch open at the same time. Therefore, a working status of the RRAM is flexibly controlled.

20 Claims, 9 Drawing Sheets

(56) References Cited

U.S. PATENT DOCUMENTS

| | | | | |
|---|---|---|---|---|
| 2009/0168495 | A1* | 7/2009 | Aoki | G11C 13/0007 365/148 |
| 2010/0182820 | A1 | 7/2010 | Kitagawa et al. | |
| 2010/0238711 | A1* | 9/2010 | Asao | G11C 8/14 365/148 |
| 2012/0039105 | A1 | 2/2012 | Torige | |
| 2012/0287706 | A1* | 11/2012 | Lung | H01L 45/06 365/163 |
| 2012/0314477 | A1* | 12/2012 | Siau | G11C 8/08 365/148 |
| 2013/0010529 | A1 | 1/2013 | Hayakawa et al. | |
| 2013/0155755 | A1 | 6/2013 | Park et al. | |
| 2013/0215669 | A1* | 8/2013 | Haukness | G11C 13/0007 365/148 |
| 2014/0036573 | A1 | 2/2014 | Ishihara et al. | |
| 2014/0172937 | A1 | 6/2014 | Linderman et al. | |
| 2016/0148683 | A1* | 5/2016 | Yoon | G11C 13/004 365/148 |
| 2016/0172028 | A1* | 6/2016 | Park | G11C 13/0026 365/148 |
| 2016/0225442 | A1* | 8/2016 | Asnaashari | G11C 13/0069 |
| 2018/0040374 | A1* | 2/2018 | Zheng | G11C 15/046 |

FOREIGN PATENT DOCUMENTS

| | | |
|---|---|---|
| CN | 102460586 A | 5/2012 |
| CN | 102542334 A | 7/2012 |
| CN | 103165180 A | 6/2013 |
| CN | 103229299 A | 7/2013 |
| CN | 103455843 A | 12/2013 |
| CN | 103810497 A | 5/2014 |
| CN | 104299645 A | 1/2015 |

OTHER PUBLICATIONS

"Pattern recognition", http://baike.baidu.com/view/14685.htm?fr=aladdin, Retrieved on the internet on Dec. 2017, 15 pages.
Yeongkyo, S., et al., "Spin—Hall Magnetic Random-Access Memory With Dual Read/Write Ports for On—Chip Caches," XP011579964, IEEE Magnetics Letters, vol. 6, Apr. 13, 2015, 4 pages.
Foreign Communication From a Counterpart Application, Chinese Application No. 201580073259.1, Chinese Office Action dated Aug. 30, 2019, 5 pages.
Foreign Communication From a Counterpart Application, Chinese Application No. 201580073259.1, Chinese Search Report dated Aug. 22, 2019, 2 pages.
Seo, Y., et al., "Spin — Hall Magnetic Random-Access Memory With Dual Read/Write Ports for On — Chip Caches," XP011579964, IEEE Magnetics Letters, vol. 6, Apr. 13, 2015, 4 pages.
"Process Integration, Devices, and Structures," International Technology Roadmap for Semiconductors, 2013 Edition, XP055457551, Jan. 2013, 51 pages.
Foreign Communication From A Counterpart Application, European Application No. 15893702.9, Extended European Search Report dated Mar. 19, 2018, 10 pages.
Chu, M., et al. "Neuromorphic Hardware System for Visual Pattern Recognition With Memristor Array and CMOS Neuron", IEEE Transactions on Industrial Electronics, vol. 62, No. 4, Apr. 2015. pp. 2410-2419.
Querlioz, Q., et al. "Bioinspired Networks with Nanoscale Memristive Devices that Combine the Unsupervised and Supervised Learning Approaches", IEEE/ACM Nanoarch, 2012, pp. 203-210.
Perez-Carrasco, J.A. et al. "On Neuromorphic Spiking Architectures for Asynchronous STDP Memristive Systems", IEEE, 2010, pp. 1659-1662.
Snider, G., "Spike-Timing-Dependent Learning in Memristive Nanodevices", IEEE/ACM International Symposium on Nanoscale Architectures, 2008, pp. 85-92.
Starzyk, J, et al., "Memristor Crossbar Architecture for Synchronous Neural Networks," IEEE Transactions on Circuits and Systems—I: Regular Papers, vol. 61, No. 8, Aug. 2014, pp. 2390-2401.
Rothenbuhler, A. "A Memristor-Based Neuromorphic Computing Application", Boise State University, May 2013, 130 pages.
"Pattern recognition", http://baike.baidu.com/view/14685.htm?fr=aladdin, Retrieved on the internet on Dec. 5, 2017, 15 pages.
English Translation of "Pattern recognition", http://baike.baidu.com/view/14685.htm?fr=aladdin, Retrieved on the Internet on Dec. 5, 2017, 9 pages.
Machine Translation and Abstract of Chinese Publication No. CN102542334, Jul. 4, 2012, 19 pages.
Machine Translation and Abstract of Chinese Publication No. CN104299645, Jan. 21, 2015, 14 pages.
Machine Translation and Abstract of Chinese Publication No. CN103810497, May 21, 2014, 27 pages.
Machine Translation and Abstract of Chinese Publication No. CN103455843, Dec. 18, 2013, 21 pages.
Machine Translation and Abstract of Chinese Publication No. CN101783170, Jul. 21, 2010, 10 pages.
Foreign Communication From A Counterpart Application, PCT Application No. PCT/CN2015/080610, English Translation on International Search Report dated Sep. 24, 2015, 2 pages.
Foreign Communication From A Counterpart Application, PCT Application No. PCT/CN2015/080610, English Translation on Written Opinion dated Sep. 24, 2015, 5 pages.

* cited by examiner

SIGNAL PROCESSING CIRCUIT

CROSS-REFERENCE TO RELATED APPLICATION

This application is a continuation of International Patent Application No. PCT/CN2015/080610 filed on Jun. 2, 2015, which is hereby incorporated by reference in its entirety.

TECHNICAL FIELD

The present disclosure relates to the computer field, and in particular, to a signal processing circuit.

BACKGROUND

In a computing system, a variable-resistance circuit or device usually needs to be used to store data. Such circuits or devices can be combined to form a storage module for storing data.

In other approaches, a resistive random access memory (RRAM) is used in some variable-resistance circuits to ensure that a resistance of the memory in the circuit does not change after a power failure of the circuit. However, generally these circuits cannot flexibly control a working status of the RRAM.

SUMMARY

A circuit and a signal processing circuit provided in embodiments of the present disclosure can flexibly control a working status of an RRAM.

A first aspect of the embodiments of the present disclosure provides a circuit, including an RRAM, a first switching device, and a second switching device, where a first end of the RRAM is a first end of the circuit, and a second end of the RRAM is connected to a first end of the first switching device and a first end of the second switching device separately, where a threshold voltage of the RRAM is U volts (V). A second end of the first switching device is a second end of the circuit. A second end of the second switching device is a third end of the circuit. The first switching device further includes a first control end, the second switching device further includes a second control end, the first control end and the second control end are configured to receive a control signal separately, and the control signal is used to make the first switching device closed and make the second switching device open at the same time or to make the first switching device open and make the second switching device closed at the same time, and an input potential at the first end of the circuit is $U_1$, an input potential at the second end of the circuit is $U_2$, and an input potential at the third end of the circuit is $U_3$, where $|U_1-U_3|>U$, and $|U_1-U_2|<U$.

With reference to the first aspect, in a first implementation of the first aspect, a resistance of the RRAM does not change when the first switching device is closed and the second switching device is open, or a resistance of the RRAM changes when the first switching device is open and the second switching device is closed.

With reference to the first aspect, in a second implementation of the first aspect, $U_3=-U_1$, and $U_2=0$ V.

With reference to the first aspect or the first or second implementation of the first aspect, in a third implementation of the first aspect, the first switching device is a P-channel metal oxide semiconductor (PMOS), the second switching device is an N-channel metal oxide semiconductor (NMOS), a gate of the PMOS is the first control end, and a gate of the NMOS is the second control end. The gate of the PMOS and the gate of the NMOS receive a same control signal, and the same control signal is a same voltage signal, when the voltage signal is at a low potential, the first end of the first switching device is connected to the second end of the first switching device, and the first end of the second switching device is disconnected from the second end of the second switching device, and when the voltage signal is at a high potential, the first end of the second switching device is connected to the second end of the second switching device, and the first end of the first switching device is disconnected from the second end of the first switching device.

With reference to the first aspect or the first or second implementation of the first aspect, in a fourth implementation of the first aspect, the first switching device is an NMOS, the second switching device is a PMOS, a gate of the NMOS is the first control end, and a gate of the PMOS is the second control end. The gate of the NMOS and the gate of the PMOS receive a same control signal, and the same control signal is a same voltage signal, when the voltage signal is at a high potential, the first end of the first switching device is connected to the second end of the first switching device, and the first end of the second switching device is disconnected from the second end of the second switching device, and when the voltage signal is at a low potential, the first end of the second switching device is connected to the second end of the second switching device, and the first end of the first switching device is disconnected from the second end of the first switching device.

With reference to the first aspect or the first or second implementation of the first aspect, in a fifth implementation of the first aspect, the first switching device is a first transmission gate (TG), the second switching device is a second TG, a positive control end of the first TG is the first control end, and a negative control end of the second TG is the first control end. The positive control end of the first TG and the negative control end of the second TG receive a same control signal, and the same control signal is a same voltage signal, when the voltage signal is at a high potential, the first end of the first switching device is connected to the second end of the first switching device, and the first end of the second switching device is disconnected from the second end of the second switching device, and when the voltage signal is at a low potential, the first end of the second switching device is connected to the second end of the second switching device, and the first end of the first switching device is disconnected from the second end of the first switching device.

With reference to the first aspect or the first or second implementation of the first aspect, in a sixth implementation of the first aspect, the first switching device is a first TG, the second switching device is a second TG, a negative control end of the first TG is the first control end, and a positive control end of the second TG is the second control end. The negative control end of the first TG and the positive control end of the second TG receive a same control signal, and the same control signal is a same voltage signal, when the voltage signal is at a low potential, the first end of the first switching device is connected to the second end of the first switching device, and the first end of the second switching device is disconnected from the second end of the second switching device, and when the voltage signal is at a high potential, the first end of the second switching device is connected to the second end of the second switching device, and the first end of the first switching device is disconnected from the second end of the first switching device.

A second aspect of the embodiments of the present disclosure provides a signal processing circuit, including a processing module and at least one circuit group, where each circuit group includes N circuits according to the first aspect or any one of the implementations of the first aspect, and N is a natural number greater than zero. Second ends of all circuits in each circuit group are connected to form an output end of each circuit group. First control ends of all circuits in each circuit group are connected to form a first control end of each circuit group, and second control ends of all circuits in each circuit group are connected to form a second control end of each circuit group. The output end of each circuit group, the first control end of each circuit group, and the second control end of each circuit group are all connected to the processing module, and the processing module is configured to connect a first end of each circuit in each circuit group to a second end of the circuit in the circuit group using the first control end of the circuit group, or to connect the first end of each circuit in each circuit group to a third end of the circuit in the circuit group using the second control end of the circuit group.

A third aspect of the embodiments of the present disclosure provides a signal analysis method, for performing signal analysis using the signal processing circuit according to the second aspect of the embodiments of the present disclosure, where the signal processing circuit includes the two circuit groups, and the method includes connecting a first end of each circuit in each circuit group to a third end of the circuit in the circuit group, receiving two groups of input signals using the two circuit groups, where each group of input signals includes N pairs of differential signals, one potential of each pair of differential signals of a first group of input signals is input through a first end of each circuit in a first circuit group, the other potential of each pair of differential signals of the first group of input signals is input through a third end of each circuit in the first circuit group, one potential of each pair of differential signals of a second group of input signals is input through a first end of each circuit in a second circuit group, and the other potential of each pair of differential signals of the second group of input signals is input through a third end of each circuit in the second circuit group, connecting the first end of each circuit in each circuit group to a second end of the circuit in the circuit group, receiving a third group of input signals using the two circuit groups, where a potential of the third group of input signals is input through the first end of each circuit in the first circuit group, and a potential of the third group of input signals is input through the first end of each circuit in the second circuit group, obtaining, through an output end of the first circuit group, a current of the third group of input signals passing through the first circuit group, obtaining, through an output end of the second circuit group, a current of the third group of input signals passing through the second circuit group, and determining, according to the obtained current of the third group of input signals passing through the first circuit group and the obtained current of the third group of input signals passing through the second circuit group, that the third group of input signals matches the first group of input signals or the third group of input signals matches the second group of input signals.

With reference to the third aspect, in a first implementation of the third aspect, a first end of an RRAM of each circuit in each circuit group is a forward direction input end, and determining, according to the obtained current of the third group of input signals passing through the first circuit group and the obtained current of the third group of input signals passing through the second circuit group, that the third group of input signals matches the first group of input signals or the third group of input signals matches the second group of input signals includes determining that the third group of input signals matches the first group of input signals if the current of the third group of input signals passing through the first circuit group is greater than the current of the third group of input signals passing through the second circuit group, determining that the third group of input signals matches the second group of input signals if the current of the third group of input signals passing through the second circuit group is greater than the current of the third group of input signals passing through the first circuit group.

With reference to the third aspect, in a second implementation of the third aspect, a first end of an RRAM of each circuit in each circuit group is a reverse direction input end, and determining, according to the obtained current of the third group of input signals passing through the first circuit group and the obtained current of the third group of input signals passing through the second circuit group, that the third group of input signals matches the first group of input signals or the third group of input signals matches the second group of input signals includes determining that the third group of input signals matches the second group of input signals if the current of the third group of input signals passing through the first circuit group is greater than the current of the third group of input signals passing through the second circuit group, or determining that the third group of input signals matches the first group of input signals if the current of the third group of input signals passing through the second circuit group is greater than the current of the third group of input signals passing through the first circuit group.

According to the foregoing embodiments, the circuit provided in the embodiments of the present disclosure can complete flexible switching of working statuses of the circuit using two switching devices and an RRAM such that the circuit can enter a resistance-variability state, or a resistance-invariability current output state. The circuit has a simple structure. In addition, after multiple circuits are combined with a processing module, the processing module can simultaneously manage the multiple circuits. A signal processing circuit implemented after the combination can be configured to store and process multiple groups of input signals.

BRIEF DESCRIPTION OF DRAWINGS

To describe the technical solutions in the embodiments of the present disclosure more clearly, the following briefly describes the accompanying drawings required for the embodiments. The accompanying drawings in the following description show some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure.

Figure 1:
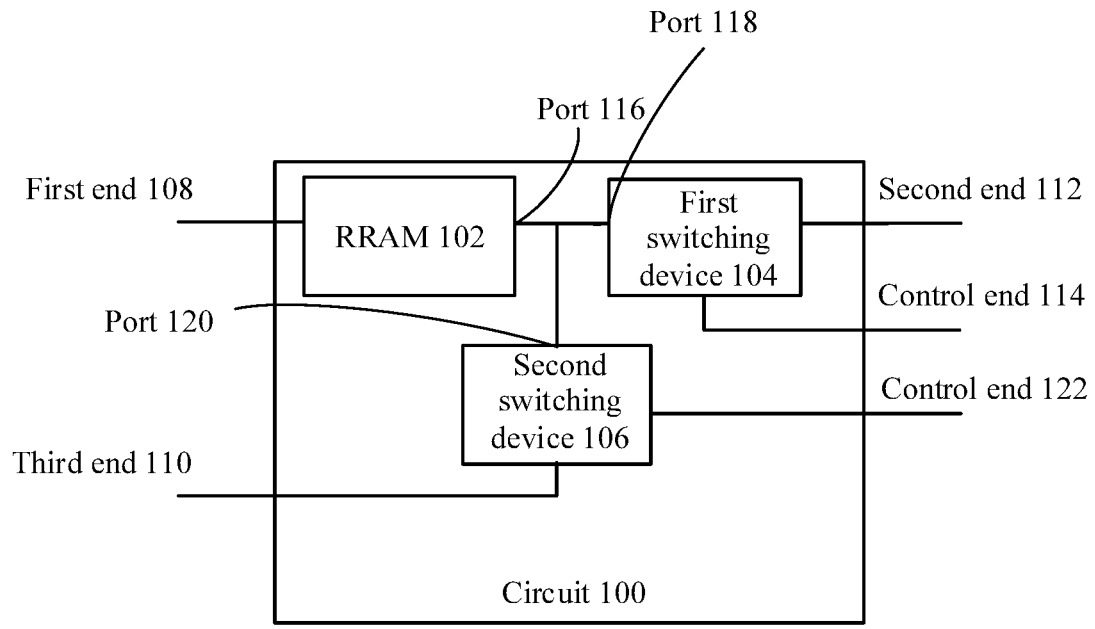
FIG. 1 is a schematic structural diagram of a circuit applied to Embodiment 1 of the present disclosure.

Throughout this specification, an RRAM is a device that can make a resistance of the device change between a high resistance and a low resistance correspondingly according to a change in a direction of a potential difference between two ends of the device. The resistance of the device is nonvolatile, that is, the resistance changes only when a voltage passing through the two ends of the device exceeds a specific threshold and remains greater than the specific threshold for a specific time period. It should be noted that, a memory resistor may be considered as a type of RRAM, and the RRAM in this application document represents any device that has the foregoing functions, also including the memory resistor. As shown in FIG. 1, generally an RRAM 102 has two ends, a first end 108 and a second end (designated as port) 116. If a potential difference from the first end 108 to the second end 116 is greater than a threshold voltage of the RRAM 102 within a specific time period, the RRAM 102 presents a low resistance, and correspondingly, if a potential difference from the second end 116 to the first end 108 is greater than a threshold voltage of the RRAM 102 within a specific time period, the RRAM 102 presents a high resistance. Generally, in this case, the first end 108 is referred to as a forward direction input end of the RRAM 102, and the second end 116 is referred to as a reverse direction input end. Generally, the two threshold voltages of the RRAM 102 presented at the low resistance and at the high resistance are close but not exactly equal. For ease of description, in this specification, the two threshold voltages are made equal for simplification and are collectively referred to as a threshold voltage. When a resistance of the RRAM 102 changes, a voltage applied to the two ends of the RRAM 102 needs to be maintained for a specific time period. For an RRAM applied to a practical computing system, a voltage applied to two ends of the RRAM needs to be maintained for a specific quantity of clock cycles of the computing system. The foregoing is physical characteristics of the RRAM 102, and is not described again in the embodiments.

Figure 4:
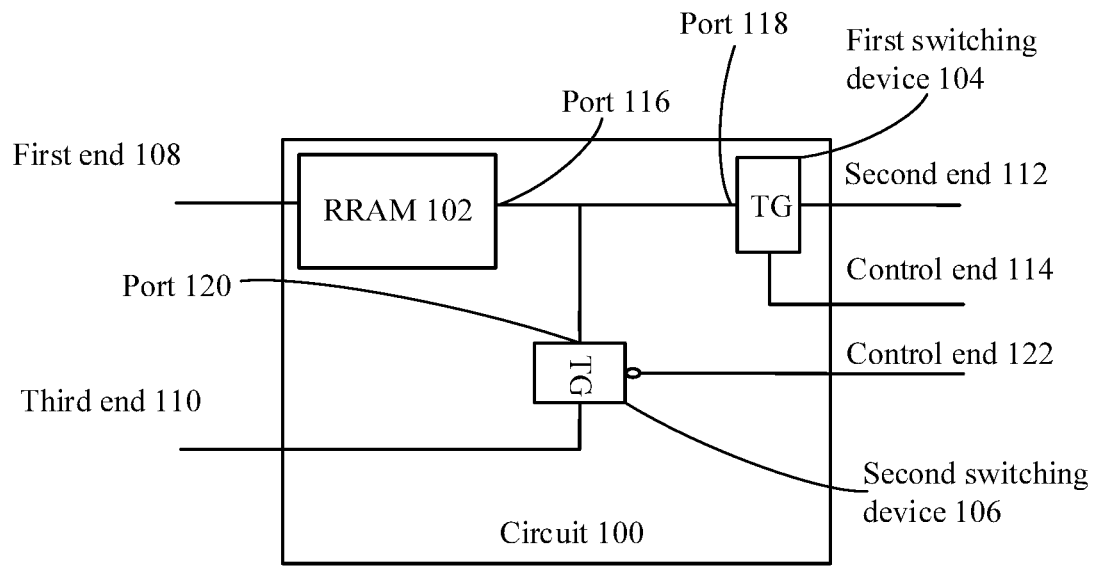
FIG. 4 is a schematic structural diagram of still another circuit applied to Embodiment 1 of the present disclosure.

Throughout this specification, a TG is also referred to as a complementary metal oxide semiconductor (CMOS) TG. As shown in FIG. 4, generally, a TG has four ends. Two ends are an input end and an output end, and the input end and the output end are interchangeable. The other two ends are a positive control end and a negative control end. In this specification, only three ends mentioned in each embodiment are indicated. When a high potential is input to the positive control end, the input end and the output end of the TG are connected. When a low potential is input to the negative control end, the input end and the output end of the TG are connected.

Throughout this specification, a pair of differential signals represents a pair of equal-size and opposite-polarity signals, for example, +5 V and −5 V are a pair of differential signals. In addition, the high potential in this specification means that when the potential is applied to a gate of an NMOS or a positive control end of the TG, the NMOS or the TG can be closed. For example, when a source of the NMOS is grounded, assuming that a potential difference from the gate to the source of the NMOS is greater than +5, the source and a drain of the NMOS are connected, and the high potential for the NMOS is a potential greater than +5. Similarly, the low potential in this specification means that when the potential is applied to a gate of a PMOS or a negative control end of the TG, the PMOS or the TG can be closed. For example, when a source of the PMOS is grounded, assuming that a potential difference from the gate to the source of the PMOS is less than −5, the source of the PMOS is connected to a drain of the PMOS, and the low potential for the PMOS is a potential less than −5.

Device Embodiment 1

Device Embodiment 1 provides a variable-resistance circuit 100. A schematic structural diagram of the circuit 100 is shown in FIG. 1. The circuit 100 includes an RRAM 102, a first switching device 104, and a second switching device 106.

Two ends of the RRAM 102 are a first end 108 and a port 116. The first end 108 is a first end of the circuit 100, and the port 116 is connected to a port 118 of the first switching device 104 and a port 120 of the second switching device 106 separately.

The first switching device 104 further includes a second end 112 and a control end 114. The control end 114 is configured to receive a control signal, and the control signal is used to control the first switching device 104 to be closed or open, that is, connection or disconnection between the second end 112 and the port 118.

The second switching device 106 further includes a third end 110 and a control end 122. The third end 110 is a third end of the circuit 100, the control end 122 is configured to receive a control signal, and the control signal is used to control the second switching device 106 to be closed or open, that is, connection or disconnection between the third end 110 and the port 120.

The control signal received by the control end 114 and the control signal received by the control end 122 are used to control the first switching device 104 to be closed and the second switching device 106 to be open, or to control the first switching device 104 to be open and the second switching device 106 to be closed.

The control signal received by the control end 114 and the control signal received by the control end 122 may be a same potential signal or different potential signals.

Further, when the first switching device 104 is closed, that is, when the second end 112 and the port 118 are connected, the second switching device 106 is open, that is, the third end 110 is disconnected from the port 120. When the second switching device 106 is closed, the first switching device 104 is open. This ensures that the circuit 100 may switches between a first working state and a second working state instead of triggering the two working states simultaneously. In the first working state, the first switching device 104 is closed, the second switching device 106 is open, signals input to the first end 108 and the second end 112 are loaded to two ends of the RRAM 102, and a resistance of the RRAM 102 does not change. In the second working state, the second switching device 106 is closed, the first switching device 104 is open, signals input to the first end 108 and the third end 110 are loaded to the two ends of the RRAM 102, and the resistance of the RRAM 102 changes with potentials input to the first end 108 and the third end 110.

An input potential at the first end 108 is $U_1$, an input potential at the second end 112 is $U_2$, and an input potential at the third end 110 is $U_3$, where $|U_1-U_3|>U$, $|U_1-U_2|<U$, and U is a threshold voltage of the RRAM 102. That is, a voltage between the input potential at the first end 108 and the second end 112 is less than the threshold voltage of the RRAM 102 to ensure that the resistance of the RRAM 102 does not change when the circuit 100 is in the first working state, and a voltage between the first end 108 and the third end 110 is greater than the threshold voltage of the RRAM 102 to ensure that when the circuit 100 is in the second working state, a voltage applied to the two ends of the RRAM 102 by the first end 108 and the third end 110 can change the resistance of the RRAM 102.

Optionally, $U_3=-U_1$, that is, signals input to the first end 108 and the third end 110 are a pair of differential signals, and $U_2=0$ V.

The following describes in detail multiple possible composition manners of the circuit 100.

It should be noted that, in the following composition manners, the second end 112 in each composition manner is further configured to output a current when the circuit 100 is in the first working state. Generally, in practice, a constant potential is input to the second end 112, and a common potential at the second end 112 is 0 V.

Figure 2:
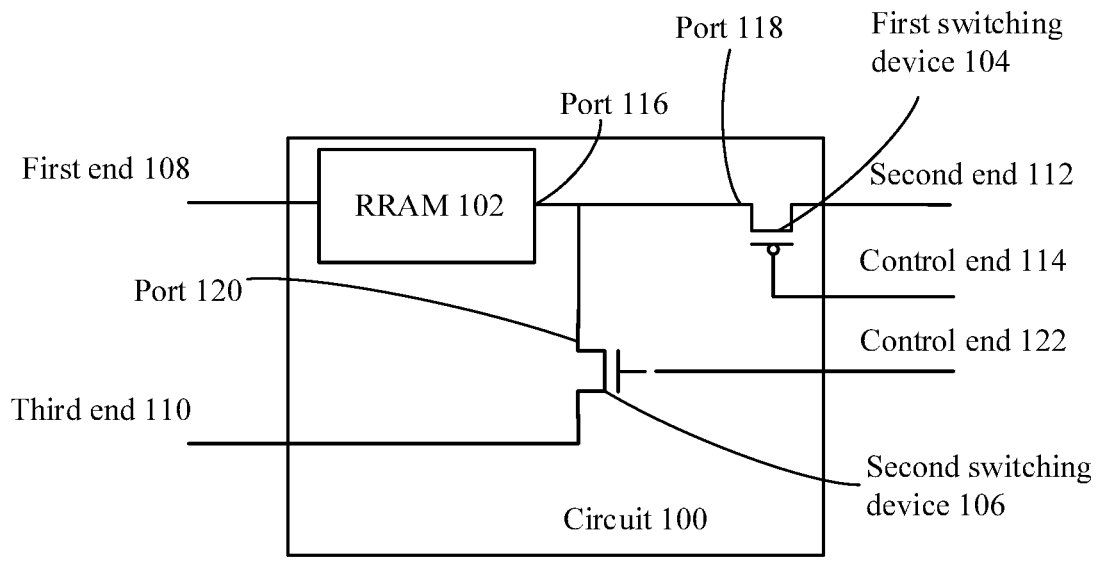
FIG. 2 is a schematic structural diagram of another circuit applied to Embodiment 1 of the present disclosure.

Composition manner 1: As shown in FIG. 2, a control signal received by the control end 114 and a control signal received by the control end 122 are a same voltage signal, and the control end 114 and the control end 122 may be combined into one control end to receive a same control signal. The first switching device 104 is a PMOS, the second switching device 106 is an NMOS, a gate of the PMOS is the control end 114, and a gate of the NMOS is the control end 122.

When the control signal is at a low potential, the first switching device 104 is connected because a characteristic of the PMOS is that the PMOS is connected when a voltage between the gate and a source is less than a specific threshold (assuming that the threshold is $U_{pgs}$), and the circuit 100 is in the first working state. When the control signal is at a high potential, the second switching device 106 is connected because a characteristic of the NMOS is that the NMOS is connected when a voltage between the gate and a source is greater than a specific threshold (assuming that the threshold is $U_{ngs}$), and the circuit 100 is in the second working state.

It should be noted that, in practice, although both the gate of the NMOS and the gate of the PMOS are connected to control ends, and potentials of the NMOS and the PMOS are determined by input signals at the control ends, a change of a method for connecting the source of the NMOS and a drain of the NMOS or for connecting the source of the PMOS and a drain of the PMOS can still cause a change in input potential requirements of the first end 108, the third end 110, the control end 114, and the control end 122 of the circuit 100. It is assumed that an input potential at the first end 108 is $V_{in1}$, and an input potential at the third end 110 is $V_{in2}$, $V_{in1}$ and $V_{in2}$ are equal in size and opposite in polarity, input potentials of the control end 114 and the control end 122 at a low level are $V_{cl}$, input potentials at the control end 114 and the control end 122 at a high level are $V_{ch}$, and a potential at the second end 112 is $V_{out}$.

When the low level $V_{cl}$ is input to the control end 114 and the control end 122, it needs to ensure that the PMOS is closed, and the NMOS is open. When the high level $V_{ch}$ is input to the control end 114 and the control end 122, it needs to ensure that the NMOS is closed, and the PMOS is open. If the port 118 is a source, the following needs to be met:

$$V_{cl}+|V_{in1}|<U_{pgs}, \text{ and} \quad (1)$$

$$V_{ch}-|V_{in1}|>U_{pgs}. \quad (2)$$

If the second end 112 is a source, the following needs to be met:

$$V_{cl}+|V_{out}|<U_{pgs}, \text{ and} \quad (3)$$

$$V_{ch}-|V_{out}|>U_{pgs}. \quad (4)$$

If $V_{out}$ is 0, in practice, regardless how the source of the PMOS is connected to the drain of the PMOS, potentials of input ends and control ends of the PMOS need to meet only the formula (1) and the formula (2).

In addition, for the NMOS, the following needs to be met:

$$V_{ch}-|V_{in1}|>U_{ngs}, \text{ and} \quad (5)$$

$$V_{cl}+|V_{in1}|<U_{ngs}. \quad (6)$$

In the foregoing composition manner 1, regardless how the source of the NMOS is connected to the drain of the NMOS or how the source of the PMOS is connected to the drain of the PMOS, it needs to ensure that both the two switching devices cannot be in a connected state at the same time under various input conditions. For a potential relationship between an input end and a control end in another composition manner, refer to detailed descriptions in composition manner 1. Details are not repeated in this specification again.

Figure 3:
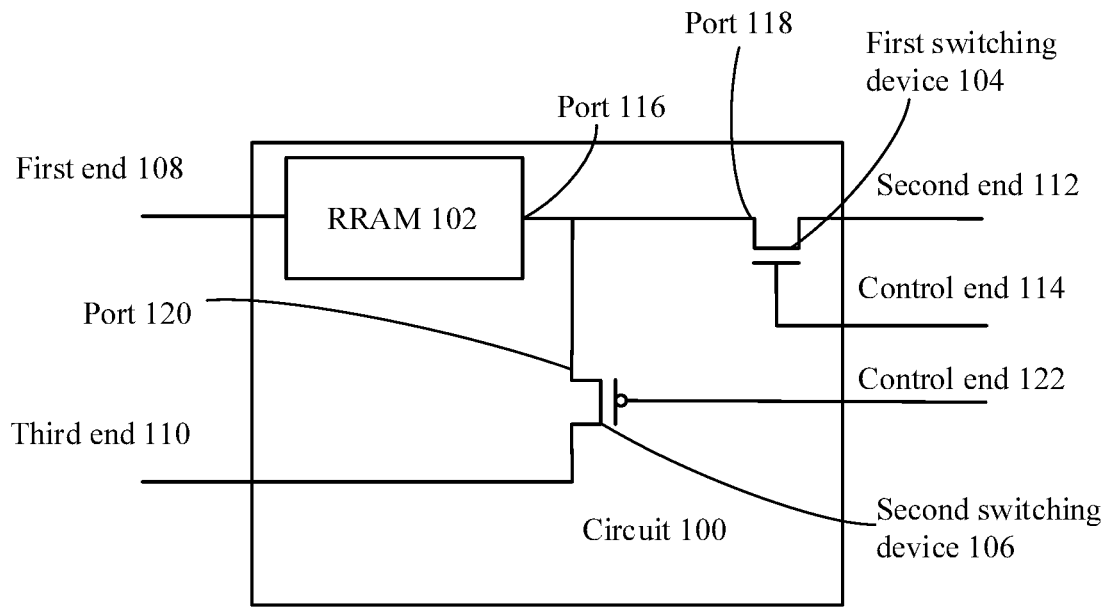
FIG. 3 is a schematic structural diagram of still another circuit applied to Embodiment 1 of the present disclosure.

Composition manner 2: As shown in FIG. 3, a control signal received by the control end 114 and a control signal received by the control end 122 are a same voltage signal, and the control end 114 and the control end 122 may be combined into one control end to receive a same control signal. The first switching device 104 is an NMOS, the second switching device 106 is a PMOS, a gate of the NMOS is the control end 114, and a gate of the PMOS is the control end 122.

When the control signal is at a high potential, the first switching device 104 is closed, and the circuit 100 is in the first working state. When the control signal is at a low potential, the second switching device 106 is closed, and the circuit 100 is in the second working state.

Composition manner 3: As shown in FIG. 4, a control signal received by the control end 114 and a control signal received by the control end 122 are a same voltage signal, and the control end 114 and the control end 122 may be combined into one control end to receive a same control signal. Both the first switching device 104 and the second switching device 106 are TGs, a positive control end of the first switching device 104 is the control end 114, and a negative control end of the second switching device 106 is the control end 122.

When the control signal is at a high potential, the first switching device 104 is closed, and the circuit 100 is in the first working state. When the control signal is at a low potential, the second switching device 106 is closed, and the circuit 100 is in the second working state.

Figure 5:
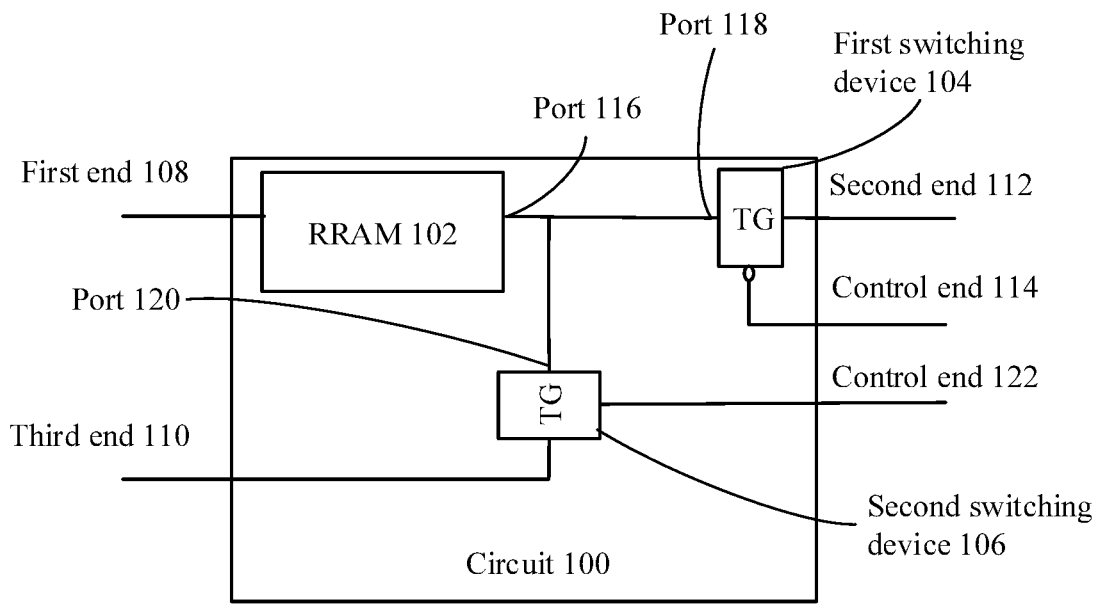
FIG. 5 is a schematic structural diagram of still another circuit applied to Embodiment 1 of the present disclosure.

Composition manner 4: As shown in FIG. 5, a control signal received by the control end 114 and a control signal received by the control end 122 are a same voltage signal, and the control end 114 and the control end 122 may be combined into one control end to receive a same control signal. Both the first switching device 104 and the second switching device 106 are TGs, a negative control end of the first switching device 104 is the control end 114, and a positive control end of the second switching device 106 is the control end 122.

When the control signal is at a low potential, the first switching device 104 is closed, and the circuit 100 is in the first working state. When the control signal is at a high potential, the second switching device 106 is closed, and the circuit 100 is in the second working state.

Figure 6:
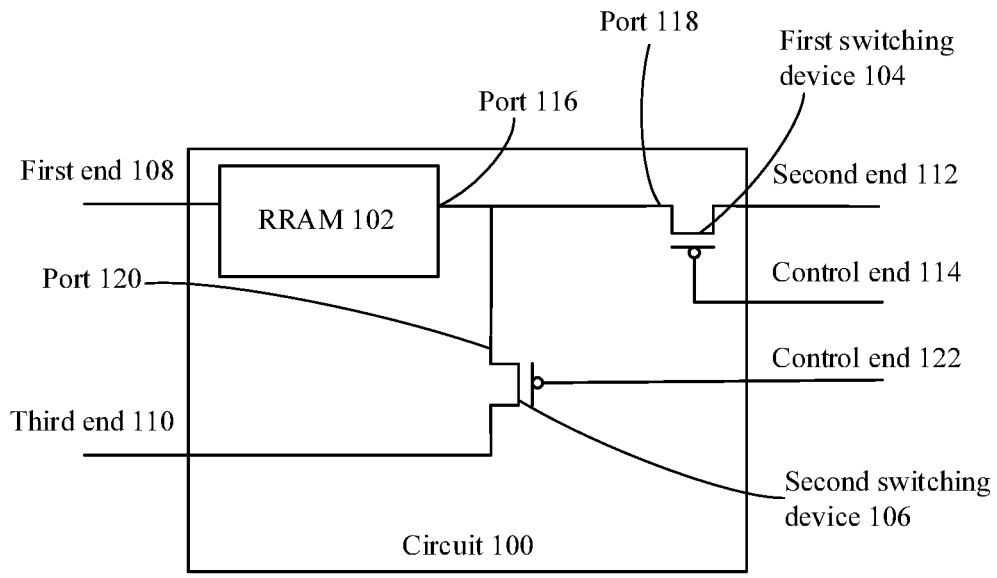
FIG. 6 is a schematic structural diagram of still another circuit applied to Embodiment 1 of the present disclosure.

Composition manner 5: As shown in FIG. 6, a control signal received by the control end 114 and a control signal received by the control end 122 are different control signals. Both the first switching device 104 and the second switching device 106 are the PMOSs, a gate of the first switching device 104 is the control end 114, and a gate of the second switching device 106 is the control end 122.

When the control signal received by the control end 114 is at a low potential and the control signal received by the control end 122 is at a high potential, the first switching device 104 is closed, and the circuit 100 is in the first working state. When the control signal received by the control end 114 is at a high potential and the control signal received by the control end 122 is at a low potential, the second switching device 106 is closed, and the circuit 100 is in the second working state.

Figure 7:
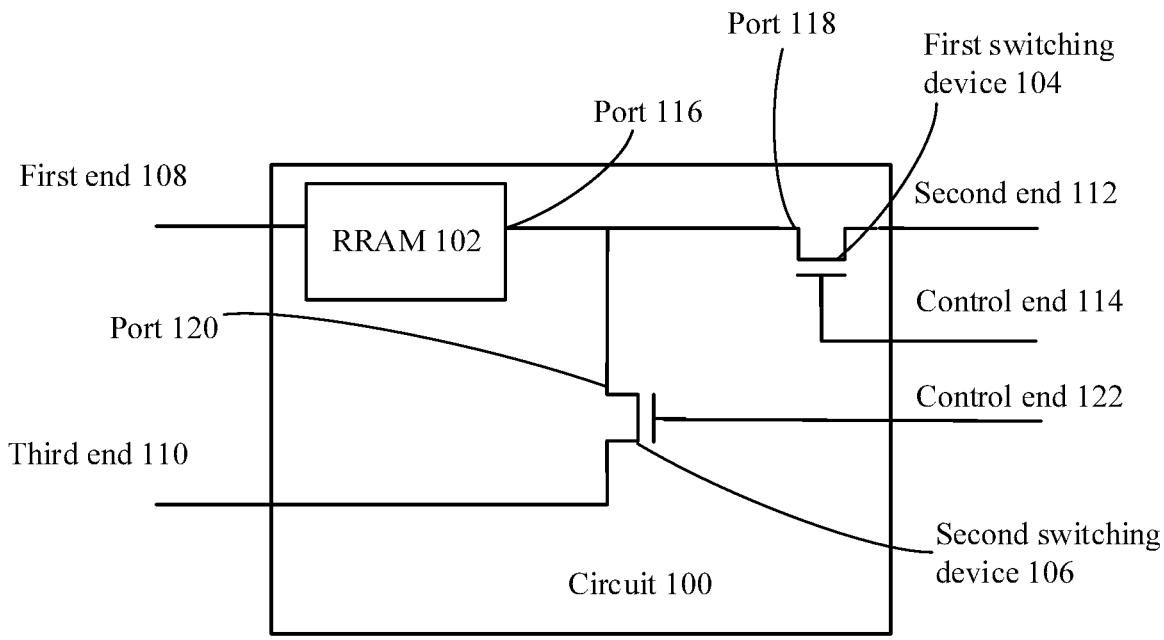
FIG. 7 is a schematic structural diagram of still another circuit applied to Embodiment 1 of the present disclosure.

Composition manner 6: As shown in FIG. 7, a control signal received by the control end 114 and a control signal received by the control end 122 are different control signals. Both the first switching device 104 and the second switching device 106 are the NMOSs, a gate of the first switching device 104 is the control end 114, and a gate of the second switching device 106 is the control end 122.

When the control signal received by the control end 114 is at a high potential and the control signal received by the control end 122 is at a low potential, the first switching device 104 is closed, and the circuit 100 is in the first working state. When the control signal received by the control end 114 is at a low potential and the control signal received by the control end 122 is at a high potential, the second switching device 106 is closed, and the circuit 100 is in the second working state.

Figure 8:
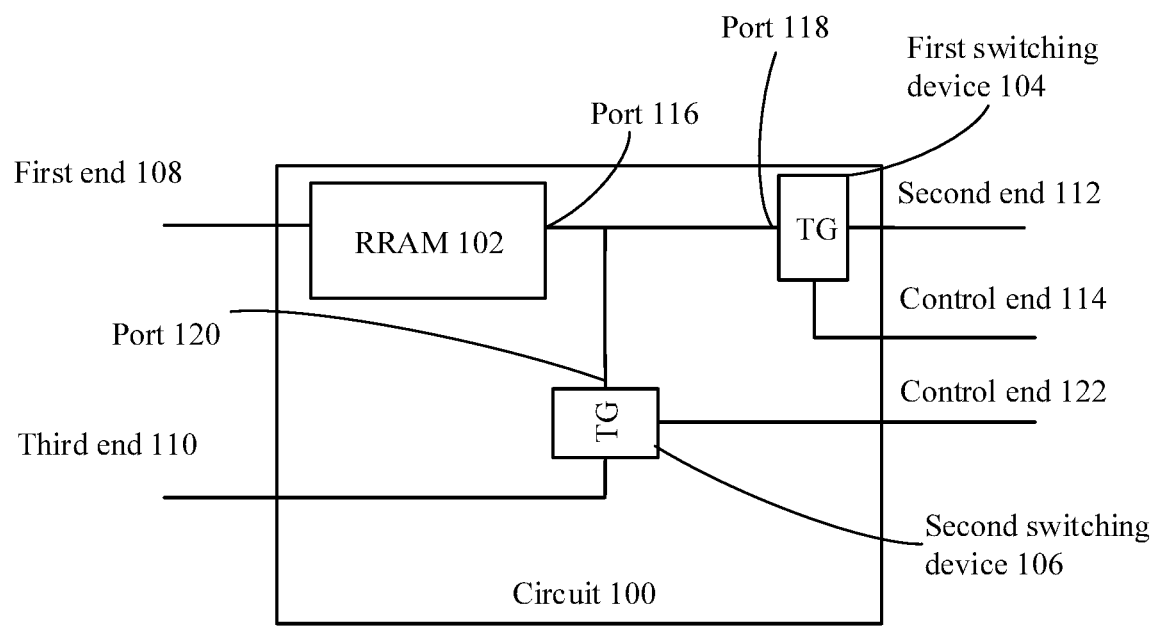
FIG. 8 is a schematic structural diagram of still another circuit applied to Embodiment 1 of the present disclosure.

Composition manner 7: As shown in FIG. 8, a control signal received by the control end 114 and a control signal received by the control end 122 are different control signals. Both the first switching device 104 and the second switching device 106 are TGs, a positive control end of the first switching device 104 is the control end 114, and a positive control end of the second switching device 106 is the control end 122.

When the control signal received by the control end 114 is at a high potential and the control signal received by the control end 122 is at a low potential, the first switching device 104 is closed, and the circuit 100 is in the first working state. When the control signal received by the control end 114 is at a low potential and the control signal received by the control end 122 is at a high potential, the second switching device 106 is closed, and the circuit 100 is in the second working state.

Figure 9:
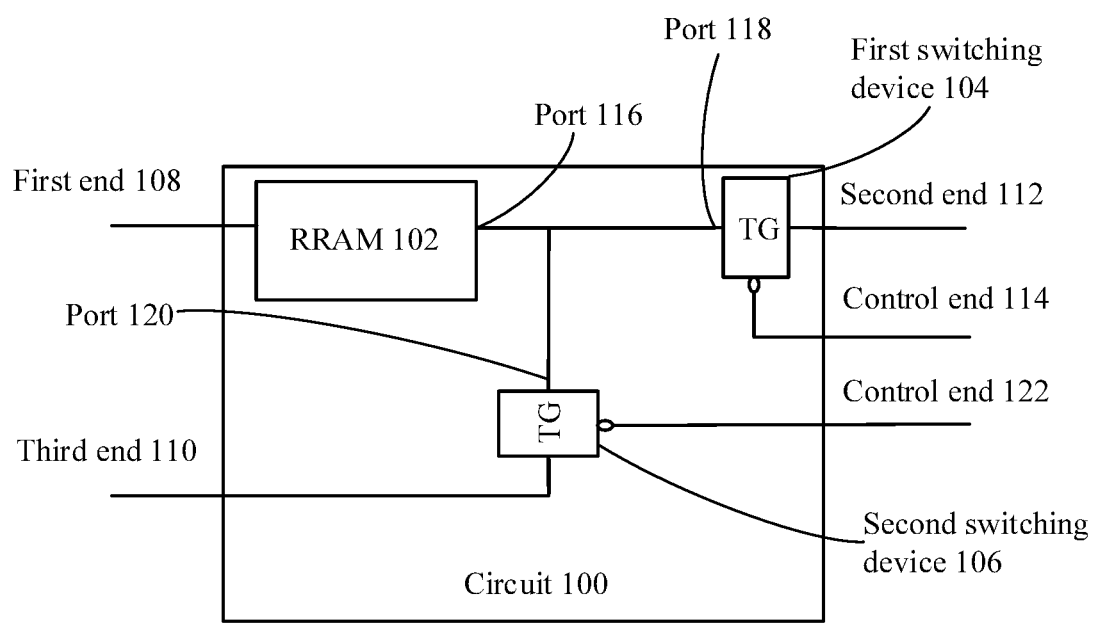
FIG. 9 is a schematic structural diagram of still another circuit applied to Embodiment 1 of the present disclosure.

Composition manner 8: As shown in FIG. 9, a control signal received by the control end 114 and a control signal received by the control end 122 are different control signals. Both the first switching device 104 and the second switching device 106 are TGs, a negative control end of the first switching device 104 is the control end 114, and a negative control end of the second switching device 106 is the control end 122.

When the control signal received by the control end 114 is at a low potential and the control signal received by the control end 122 is at a high potential, the first switching device 104 is closed, and the circuit 100 is in the first working state. When the control signal received by the control end 114 is at a high potential and the control signal received by the control end 122 is at a low potential, the second switching device 106 is closed, and the circuit 100 is in the second working state.

Another composition manner: In the foregoing composition manners 1 to 4, the control end 114 and the control end 122 of the circuit 100 receive a same signal, and therefore the two control ends can be combined in practice. In addition, in composition manners 5 to 8, the control signal received by the control end 114 of the circuit 100 is opposite in polarity to the control signal received by the control end 122 of the circuit 100, and therefore the control end 114 and the control end 122 may receive a control signal separately, or a phase inverter is installed on the control end 114 or the control end 122, and then in composition manners 5 to 8, the control end 114 and the control end 122 of the circuit 100 may also receive a same control signal. A signal transmitted from a control end with the phase inverter to a switching device is opposite to a signal transmitted from a control end without the phase inverter to a switching device. This design may be applied to any one of composition manners 5 to 8.

In this device embodiment, one end of the RRAM 102 is connected to the first end 108 of the circuit 100, and another end is connected to the second end 112 of the circuit 100 using the first switching device 104, and connected to the third end 110 of the circuit 100 using the second switching device 106 in order to implement, by controlling the first switching device 104 and the second switching device 106, that the RRAM 102 enters a resistance-variability state, or enters a resistance-invariability current output state. In this way, switching between the two statuses is flexible, and a circuit structure is simple in design.

Device Embodiment 2

Figure 10:
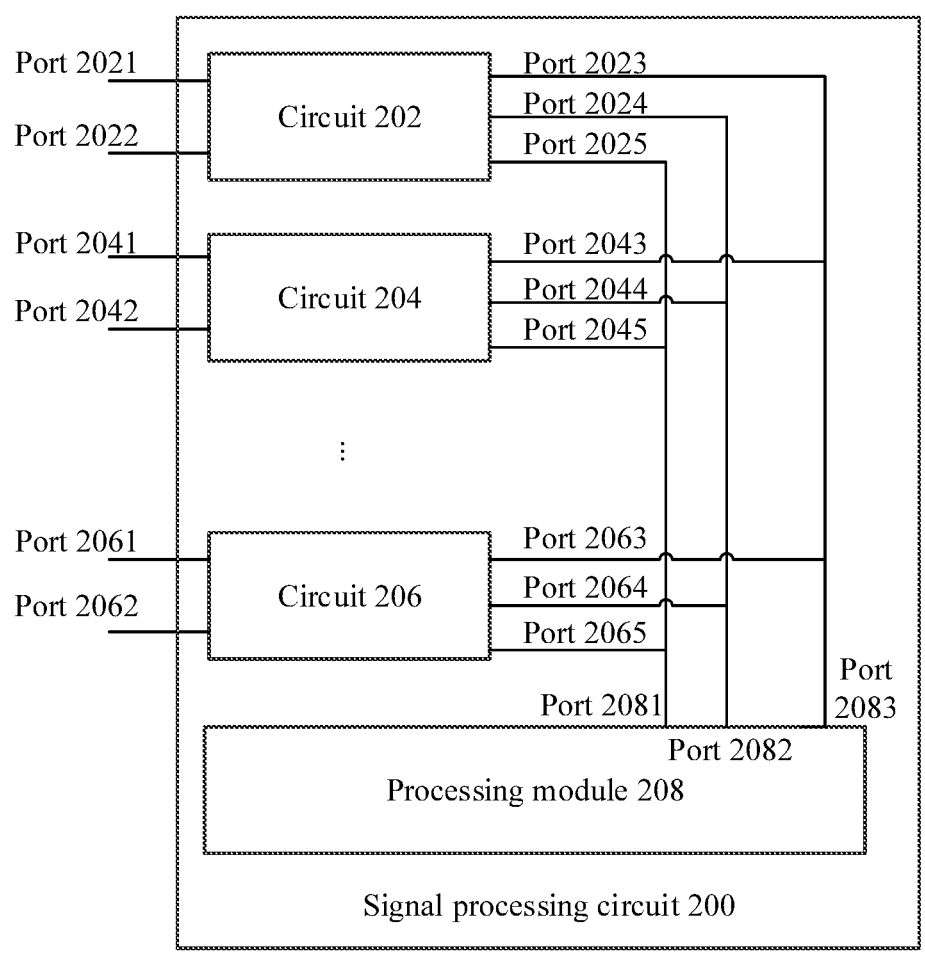
FIG. 10 is a schematic structural diagram of a signal processing circuit applied to Embodiment 2 of the present disclosure.

Device Embodiment 2 provides a signal processing circuit 200. A schematic structural diagram of the circuit 200 is shown in FIG. 10. The circuit 200 includes a processing module 208, a circuit 202, a circuit 204, and a circuit 206. The circuit 202, the circuit 204, and the circuit 206 form a circuit group. The circuit 202, the circuit 204, and the circuit 206 each are the circuit 100 in any composition manner in Device Embodiment 1. It should be noted that, in practice, one circuit group includes at least one circuit 100 in any composition manner in Device Embodiment 1. An ellipsis (i.e., not shown area) in FIG. 10 represents multiple portions similar to the circuit 202. In addition, the signal processing circuit 200 in practice may include at least one circuit group, where all circuit groups have same compositions.

Second ends of the circuit 202, the circuit 204, and the circuit 206 are connected, that is, a port 2023, a port 2043, and a port 2063 are connected to form an output end of the circuit group and are connected to a port 2083 of the processing module 208.

First control ends of the circuit 202, the circuit 204, and the circuit 206 are connected, that is, a port 2024, a port 2044, and a port 2064 are connected to form a first control end of the circuit group and are connected to a port 2082 of the processing module 208.

Second control ends of the circuit 202, the circuit 204, and the circuit 206 are connected, that is, a port 2025, a port 2045, and a port 2065 are connected to form a second control end of the circuit group and are connected to a port 2081 of the processing module 208.

First ends and third ends of the circuit 202 (i.e., port 2021 and port 2022), the circuit 204 (i.e., port 2041 and port 2042), and the circuit 206 (i.e., port 2061 and port 2062) are input ends of the circuit 200.

Optionally, if control signals received by the first control ends of the circuit 202, the circuit 204, and the circuit 206 are the same as control signals received by the second control ends of the circuit 202, the circuit 204, and the circuit 206, that is, any one of composition manners 1 to 4 or another composition manner in Device Embodiment 1 is used for the circuit 202, the circuit 204, and the circuit 206, the port 2024, and the port 2044, the port 2064, the port 2025, the port 2045, and the port 2065 may be all connected, and be connected to the processing module 208.

The processing module 208 is configured to control, using the port 2081, second switching devices of the circuit 202, the circuit 204, and the circuit 206 to be closed or open, and is further configured to control, using the port 2082, first switching devices of the circuit 202, the circuit 204, and the circuit 206 to be closed or open. When controlling the first switching devices of the circuit 202, the circuit 204, and the circuit 206 to be closed, the processing module 208 also controls the second switching devices of the circuit 202, the circuit 204, and the circuit 206 to be open. When controlling the second switching devices of the circuit 202, the circuit 204, and the circuit 206 to be closed, the processing module 208 also controls the first switching devices of the circuit 202, the circuit 204, and the circuit 206 to be open.

In this device embodiment, multiple circuits 100 in Device Embodiment 1 and the processing module 208 are combined such that the processing module 208 implements, by controlling a first switching device and a second switching device, that an RRAM of each circuit included in a circuit group enters a resistance-variability state, or enters a resistance-invariability current output state. In this way, switching between the two statuses is flexible, and a circuit structure is simple in design.

Method Embodiment

Figure 11:
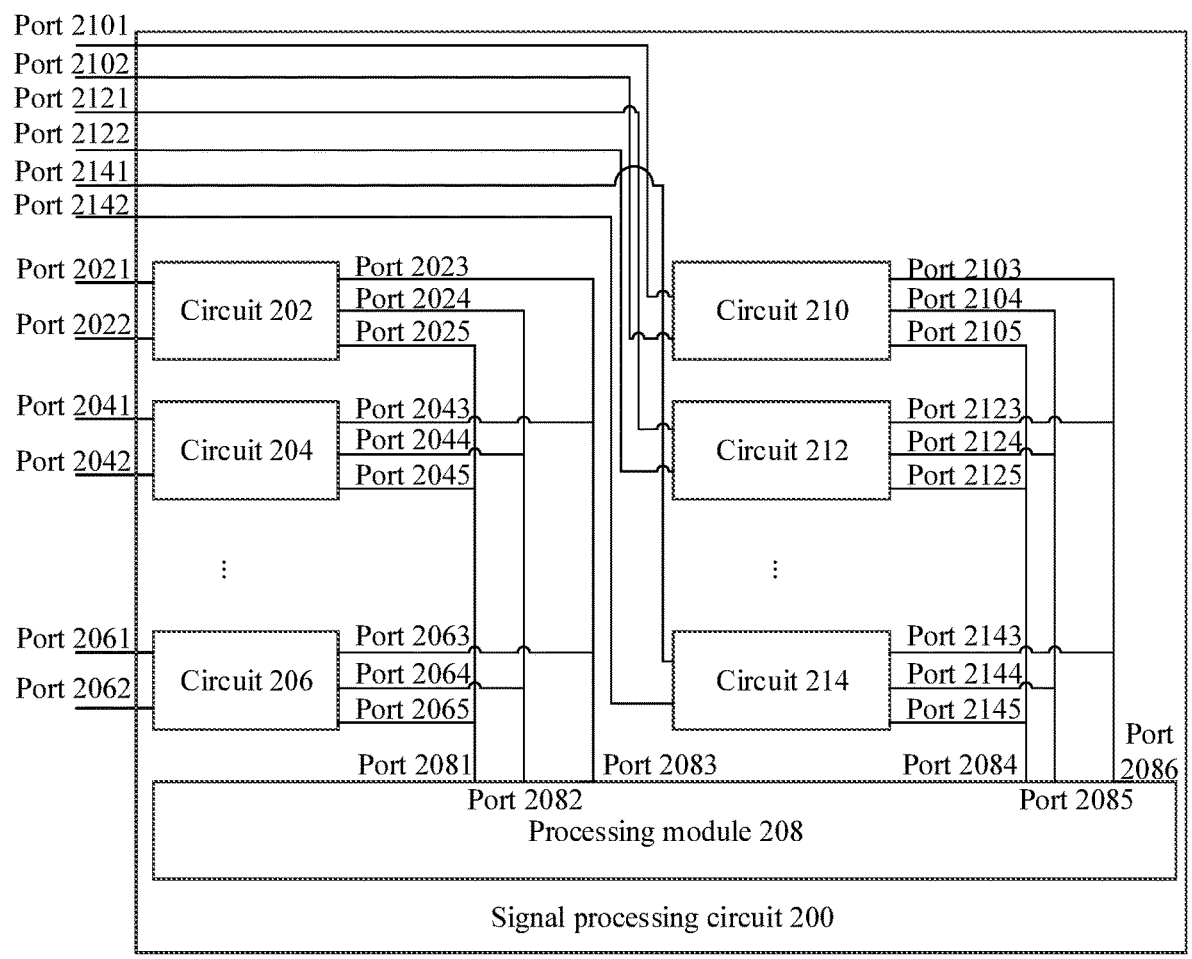
FIG. 11 is a schematic structural diagram of another signal processing circuit applied to an embodiment of the present disclosure.
Figure 13:
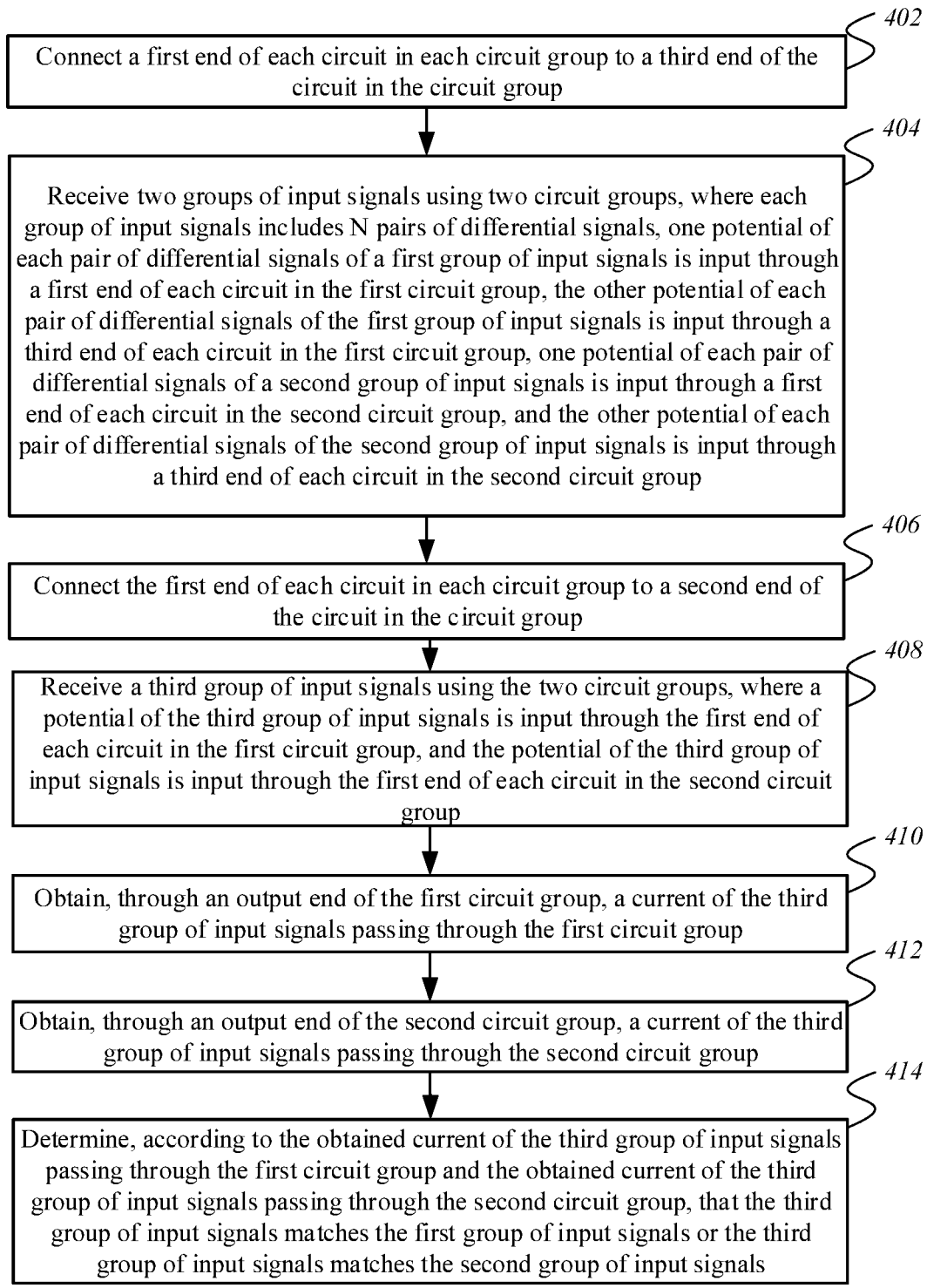
FIG. 13 is a schematic flowchart of a signal analysis method applied to a method embodiment of the present disclosure.

This method embodiment provides a signal analysis method. A schematic flowchart of the signal analysis method is shown in FIG. 13. Signal analysis is performed using the signal processing circuit 200 in Device Embodiment 2. The signal processing circuit 200 includes two circuit groups. A schematic structural diagram of the signal processing circuit 200 is shown in FIG. 11. A circuit 202, a circuit 204, and a circuit 206 form a first circuit group, and a circuit 210, a circuit 212, and a circuit 214 form a second circuit group.

Step 402: Connect a first end of each circuit in each circuit group to a third end of the circuit in the circuit group.

As shown in FIG. 11, the processing module 208 controls the circuit 202, the circuit 204, and the circuit 206 using a port 2081, and controls, using a port 2084, second switching devices of the circuit 210, the circuit 212, and the circuit 214 to be closed.

Step 404: Receive two groups of input signals respectively using the two circuit groups, where each group of input signals includes N pairs of differential signals, one potential of each pair of differential signals of a first group of input signals is input through a first end of each circuit in the first circuit group, the other potential of each pair of differential signals of the first group of input signals is input through a third end of each circuit in the first circuit group, one potential of each pair of differential signals of a second group of input signals is input through a first end of each circuit in the second circuit group, and the other potential of each pair of differential signals of the second group of input signals is input through a third end of each circuit in the second circuit group.

A quantity of differential signal pairs included in the first group of input signals is the same as a quantity of circuits 100 included in the first circuit group, a quantity of differential signal pairs included in the second group of input signals is the same as a quantity of circuits 100 included in the second circuit group. For example, in FIG. 11, the first group of input signals and the second group of input signals each include three pairs of differential signals. One potential signal of a pair of differential signals is input through the first end of each circuit in the first circuit group, and the other potential signal of the pair of differential signals is input through a third end of the circuit. For example, if a threshold voltage of an RRAM is 8 V, the first group of input signals includes three pairs of differential signals: +5 V and −5 V, +5 V and −5 V, and −5 V and +5 V, which are input to a port 2021, a port 2022, a port 2041, a port 2042, a port 2061, and a port 2062, respectively. The second group of input signals includes three pairs of differential signals: +5 V and −5 V, −5 V and +5 V, and +5 V and −5 V, which are input to a port 2101, a port 2102, a port 2121, a port 2122, a port 2141, and a port 2142, respectively. In this case, a resistance of an RRAM in each circuit in the first circuit group changes with input differential signals.

Step 406: Connect the first end of each circuit in each circuit group to a second end of the circuit in the circuit group.

As shown in FIG. 11, the processing module 208 connects a first end of each circuit in the first circuit group to a second end of the circuit in the first circuit group using a port 2082 and connects a first end of each circuit in the second circuit group to a second end of the circuit in the second circuit group using a port 2085. For example, in a first circuit group, the port 2021 and the port 2023 are connected, the port 2041 and the port 2043 are connected, and the port 2061 and the port 2063 are connected, and in a second circuit group the port 2101 and a port 2103 are connected, the port 2121 and a port 2123 are connected, and the port 2141 and the port 2143 are connected.

Step 408: Receive a third group of input signals using the two circuit groups, where a potential of the third group of input signals is input through the first end of each circuit in the first circuit group, and a potential of the third group of input signals is input through the first end of each circuit in the second circuit group.

A quantity of signals included in the third group of input signals is the same as a quantity of circuits 100 included in the first circuit group. For example, in FIG. 11, the third group of input signals is +5 V, +5 V, and −5 V, and is input to the first circuit group through the port 2021, the port 2041, and the port 2061, respectively, and are input to the second circuit group through the port 2101, the port 2121, and port 2141, respectively.

Step 410: Obtain, through an output end of the first circuit group, a current of the third group of input signals passing through the first circuit group.

In this case, the first end and the second end of each circuit in the first circuit group are connected. Therefore, after the third group of input signals is input through the first end of each circuit in the first circuit group, the processing module 208 obtains, through the output end of the first circuit group, the current of the third group of input signals passing through the first circuit group.

Step 412: Obtain, through an output end of the second circuit group, a current of the third group of input signals passing through the second circuit group.

In this case, the first end and the second end of each circuit in the second circuit group are connected. Therefore, after the third group of input signals is input through the first end of each circuit in the second circuit group, the processing module 208 obtains, through the output end of the second circuit group, the current of the third group of input signals passing through the first circuit group.

Step 414: Determine, according to the obtained current of the third group of input signals passing through the first circuit group and the obtained current of the third group of input signals passing through the second circuit group, that the third group of input signals matches the first group of input signals or the third group of input signals matches the second group of input signals.

Optionally, first ends of RRAMs of all circuits in each circuit group are forward direction input ends. That is, the port 2021, the port 2041, the port 2061, the port 2101, the port 2121, and the port 2141 are all forward direction input ends of RRAMs in corresponding circuits. Step 414 further includes determining that the third group of input signals matches a first group of signals if the current of the third group of input signals passing through the first circuit group is greater than the current of the third group of input signals passing through the second circuit group, or determining that the third group of input signals matches a second group of signals if the current of the third group of input signals passing through the second circuit group is greater than the current of the third group of input signals passing through the first circuit group.

Following the foregoing example, in step 404, when the first end of each circuit in the first circuit group is connected to the third end of the circuit in the first circuit group, the first end of each circuit in the second circuit group is connected to the third end of the circuit in the second circuit group, and all the forward direction input ends of the RRAMs in circuits 100 are input ends of the first group of input signals, RRAMs of the circuit 202, the circuit 204, and the circuit 206 have a low resistance, a low resistance, and a high resistance, respectively, and RRAMs of the circuit 210, the circuit 212, and the circuit 214 have a low resistance, a high resistance, and a low resistance, respectively. It is assumed that a high resistance of an RRAM is 100 ohms, and a low resistance is 1 ohm.

After step 406 and step 406, the third group of input signals includes three signals: +5 V, +5 V, and −5 V, which are input to the first circuit group through the port 2021, the port 2041, and the port 2061, respectively, and are input to the second circuit group through the port 2101, the port 2121, and the port 2141, respectively. Currents output from the port 2023, the port 2043, and the port 2063 are 5 amperes (A), 5 A, and −0.05 A, respectively, and a current input to the processing module 208 through the port 2083 is 9.95 A. Currents output from the port 2103, the port 2123, and the port 2143 are 5 A, 0.05 A, and −5 A, respectively, and a current input to the processing module 208 through the port 2086 is 0.05 A. The current of the third group of input signals passing through the first circuit group is greater than the current of the third group of input signals passing through the second circuit group. Therefore, the third group of input signals matches the first group of input signals. When the signal processing circuit 200 includes at least two circuit groups, after the third group of input signals is input, a circuit group having a largest output current at the output end is determined, and input signals input when a first end of the circuit group is connected to a third end of the circuit group best match the third group of input signals.

Optionally, first ends of RRAMs of all circuits in each circuit group are reverse direction input ends. That is, all the port 2021, the port 2041, the port 2061, the port 2101, the port 2121, and the port 2141 are reverse direction input ends of RRAMs in corresponding circuits. Step 414 further includes determining that the third group of input signals matches a second group of signals if the current of the third group of input signals passing through the first circuit group is greater than the current of the third group of input signals passing through the second circuit group, or determining that the third group of input signals matches a first group of signals if the current of the third group of input signals passing through the second circuit group is greater than the current of the third group of input signals passing through the first circuit group.

Compared with the foregoing example, if all reverse direction input ends of RRAMs of circuits are input ends of the first group of input signals, it is easy to learn that RRAMs of the circuit 202, the circuit 204, and the circuit 206 have a high resistance, a high resistance, and a low resistance, respectively, and RRAMs of the circuit 210, the circuit 212, and the circuit 214 have a high resistance, a low resistance, and a high resistance, respectively. After the third group of input signals is input to the first circuit group and the second circuit group, currents output from the port 2023, the port 2043, and the port 2063 are 0.05 A, 0.05 A, and −5 A, respectively, and a current input to the processing module 208 through the port 2083 is −4.9 A. Currents output from the port 2103, the port 2123, and the port 2143 are 0.05 A, 5 A, and −0.05 A, respectively, and a current input to the processing module 208 through the port 2086 is 5 A. The current of the third group of input signals passing through the second circuit group is greater than the current of the third group of input signals passing through the first circuit group. Therefore, the third group of input signals matches the first group of input signals. Further, a port 2024, a port 2044, a port 2064, a port 2104, a port 2124, and a port 2144, shown in FIG. 11 is same as the port 2024, the port 2044, and the port 2064 shown in FIG. 10, and a port 2025, a port 2045, a port 2065, a port 2105, a port 2125, and a port 2145, shown in FIG. 11 is same as the port 2025, the port 2045, and the port 2065 shown in FIG. 10.

In the device embodiment, the signal processing circuit 200 implements, under control of the processing module 208, flexible switching between a function of recording an input signal according to a changed resistance of an RRAM caused by the input signal and a function of determining matching between an input signal and a history input signal. In the state in which the input signal matches the history input signal, it is determined, according to a magnitude of a current output from an output end of each circuit group, that the input signal most matches a recorded history input signal in which circuit group. The circuit is flexibly switched and has a simple structure without a complicated logic or feedback loop.

Device Embodiment 3

Figure 12:
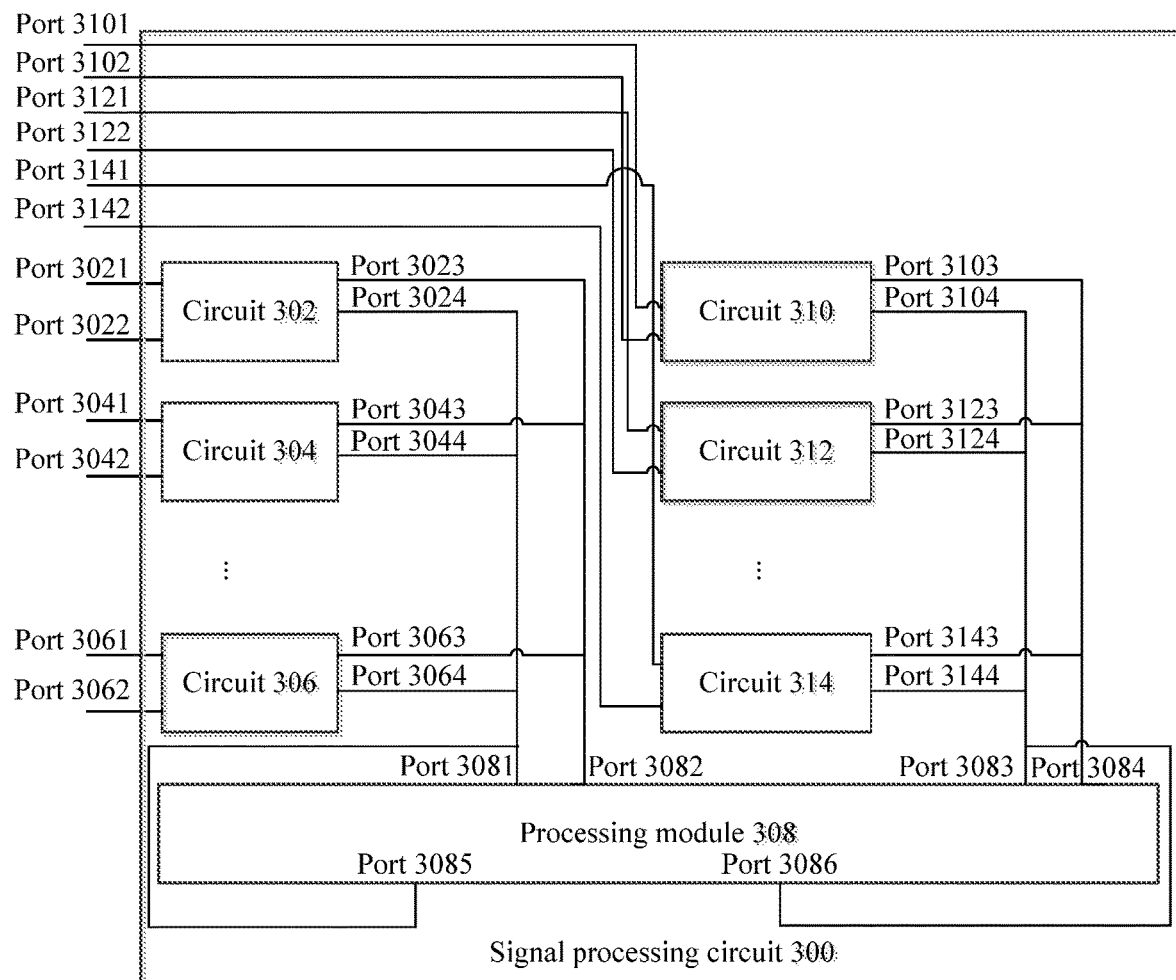
FIG. 12 is a schematic structural diagram of still another signal processing circuit applied to Embodiment 3 of the present disclosure.

The signal processing circuit 200 in the foregoing Device Embodiment 2 can implement signal matching. On the basis of Device Embodiment 2, as shown in FIG. 12, this device embodiment provides an optimized signal processing circuit 300 that may be used for signal classification, and describes in detail a process of implementing signal classification using this circuit 300. Specific theoretical analysis is not described in this embodiment.

A first control end and a second control end of the circuit 100 that is in any composition manner in Device Embodiment 1 and that is of the signal processing circuit 300 are combined. That is, the signal processing circuit 300 includes a first circuit group including circuit 302, circuit 304, and circuit 306 and a second circuit group including circuit 310, circuit 312, and circuit 314. Refer to FIG. 10 description for the description of ports of the two circuit groups and the processing module 308. For the circuits 302, 304, 306, 310, 312, and 314 in this case, refer to the composition manners in Device Embodiment 1. In addition, a processing module 308 further includes a port 3085 and a port 3086 which are connected to a control end of a first circuit group and a control end of a second circuit group, respectively.

It is assumed that a first end of any circuit 302, 304, 306, 310, 312, and 314 is a forward direction input end of an RRAM, and there are four groups of signals to be classified: +5 V, +5 V, and −5 V; −5 V, −5 V, and +5 V; +5 V, +5 V, and +5 V; and −5 V, −5 V, and −5 V. A reverse-phase signal is generated first for each potential signal of each group of signals such that each group of signals includes three pairs of differential signals, and then the four groups of signals are: (+5 V, −5 V), (+5 V, −5 V), and (−5 V, +5 V); (−5 V, +5 V), (−5 V, +5 V), and (+5 V, −5 V); (+5 V, −5 V), (+5 V, −5 V), and (+5 V, −5 V); and (−5 V, +5 V), (−5 V, +5 V), and (−5 V, +5 V). The following describes a working process of the circuit 300 in performing signal classification.

Solution 1

Step 1: Connect a first end of each circuit in the first circuit group to a third end of the circuit in the first circuit group and connect a first end of each circuit in the second circuit group to a third end of the circuit in the second circuit group, and input two groups of signals: (+5 V, −5 V), (+5 V, −5 V), and (−5 V, +5 V); and (−5 V, +5 V), (−5 V, +5 V), and (+5 V, −5 V), respectively, where (+5 V, −5 V), (+5 V, −5 V), and (−5 V, +5 V) are a first class of signals, and (−5 V, +5 V), (−5 V, +5 V), and (+5 V, −5 V) are a second class of signals.

Step 2: Connect the first end of each circuit in the first circuit group to a second end of the circuit in the first circuit group and connect the first end of each circuit in the second circuit group to a second end of the circuit in the second circuit group, and input (+5 V, −5 V), (+5 V, −5 V), and (+5 V, −5 V) to both the first circuit group and the second circuit group. If the processing module 308 determines that an output current of the first circuit group is high, it indicates that (+5 V, −5 V), (+5 V, −5 V), and (+5 V, −5 V) are more similar to (+5 V, −5 V), (+5 V, −5 V), and (−5 V, +5 V), and (+5 V, −5 V), (+5 V, −5 V), and (+5 V, −5 V) are the first class of signals.

Step 3: Connect the first end and the second end of each circuit in the first circuit group and connect the first end and the second end of each circuit in the second circuit group, and input (−5 V, +5 V), (−5 V, +5 V), and (−5 V, +5 V) to both the first circuit group and the second circuit group. If the processing module 308 determines that an output current of the second circuit group is high, it indicates that (−5 V, +5 V), (−5 V, +5 V), and (−5 V, +5 V) are more similar to (−5 V, +5 V), (−5 V, +5 V), and (+5 V, −5 V), and (−5 V, +5 V), (−5 V, +5 V), and (−5 V, +5 V) are the second class of signals.

In Solution 1, if there are more signals to be classified, step 2 is repeated after step 1 until all of the signals to be classified are classified into the first class of signals or the second class of signals.

Solution 2

Step 1: Step 1 is the same as step 1 of Solution 1.
Step 2: After step 2 of Solution 1 is performed, (+5 V, −5 V), (+5 V, −5 V), and (+5 V, −5 V) are determined as the first class of signals. A port 3085 of the processing module 308 sends a control signal instructing the first end and the third end of each circuit in the first circuit group to connect to each other. In this case, signals (+5 V, −5 V), (+5 V, −5 V), and (+5 V, −5 V) are input to all circuits in the first circuit group, and resistances of RRAMs of all the circuits in the first circuit group change with these input signals (+5 V, −5 V), (+5 V, −5 V), and (+5 V, −5 V).

Step 3: After step 3 of Solution 1 is performed, that is, the first end of each circuit in the first circuit group is connected to the second end of the circuit in the first circuit group and the first end of each circuit in the second circuit group is connected to the second end of the circuit in the second circuit group, and (−5 V, +5 V), (−5 V, +5 V), and (−5 V, +5 V) are input to both the first circuit group and the second circuit group, the processing module 308 determines that an output current of the second circuit group is high, (−5 V, +5 V), (−5 V, +5 V), and (−5 V, +5 V) are the second class of signals. The port 3086 of the processing module 308 sends a control signal instructing the first end and the third end of each circuit in the second circuit group to connect to each other. Resistances of RRAMs of all circuits in the second circuit group change with these input signals (−5 V, +5 V), (−5 V, +5 V), and (−5 V, +5 V).

In Solution 1, if there are more signals to be classified, step 2 is repeated after step 1 until all of the signals to be classified are classified into the first class of signals or the second class of signals.

In comparison with Solution 1, in Solution 2, each time after all input signals are classified, a circuit group corresponding to a class to which the signals belong is updated such that classification of subsequent signals is complete based on latest signals. The signal processing circuit in Solution 2 has stronger adaptability.

According to this device embodiment on the basis of Device Embodiment 2, the processing module 308 performs feedback about a control signal at a control port of a circuit group such that the signal processing circuit 300 can continuously update resistances of RRAMs of circuits when classifying signals, and subsequent classification is determined according to latest classification of input signals. Therefore, the signal processing circuit 300 has greater adaptability to the input signals.

In the foregoing embodiments, the description of each embodiment has respective focuses. For a part that is not described in detail in an embodiment, reference may be made to related descriptions in other embodiments. It should be noted that the circuit 100 in any composition manner in Device Embodiment 1 is also applied to Device Embodiment 2 and Device Embodiment 3. Therefore, technical details in the three device embodiments can be referred to each other.

Finally, it should be noted that the foregoing embodiments are merely intended for describing the technical solutions of the present disclosure, but not for limiting the present disclosure. Although the present disclosure is described in detail with reference to the foregoing embodiments, a person of ordinary skill in the art should understand that they may still make modifications to the technical solutions described in the foregoing embodiments or make equivalent replacements to some technical features thereof, without departing from the scope of the technical solutions of the embodiments of the present disclosure.

What is claimed is:

1. An electronic device comprising:
    a circuit comprising:
        a resistive random access memory (RRAM) comprising:
            an RRAM first end comprising a circuit first end, and
            an RRAM second end;
        a first switch comprising:
            a first switch first end coupled to the RRAM second end,
            a first switch second end comprising a circuit second end, wherein a first absolute difference between a first input potential at the circuit first end and a second input potential at the circuit second end is less than an RRAM threshold voltage, and wherein the RRAM threshold voltage is greater than zero volts, and
            a first switch control end configured to receive a first control signal; and
        a second switch comprising:
            a second switch first end coupled to the R RAM second end,
            a second switch second end decoupled from the first switch second end and comprising a circuit third end, wherein a second absolute difference of the first input potential and a third input potential at the circuit third end is greater than the RRAM threshold voltage, and
            a second switch control end configured to receive a second control signal, wherein the first control signal and the second control signal simultaneously close the first switch and open the second switch; and
    a processor coupled to the circuit and configured to switch the RRAM between a resistance-variability state and a resistance-invariability state.

2. The electronic device of claim 1, wherein a resistance of the RRAM does not change when the first switch is closed and the second switch is open.

3. The electronic device of claim 1, wherein the first switch comprises a P-channel metal oxide semiconductor (PMOS), wherein the second switch comprises an N-channel metal oxide semiconductor (NMOS), wherein a gate of the PMOS comprises the first switch control end, wherein a gate of the NMOS comprises the second switch control end, wherein the first control signal and the second control signal comprise a voltage signal, wherein the first switch first end is coupled to the first switch second end, wherein the second switch first end is decoupled from the second switch second end when the voltage signal comprises a low potential, wherein the second switch first end is coupled to the second switch second end, and wherein the first switch first end is decoupled from the first switch second end when the voltage signal comprises a high potential.

4. The electronic device of claim 1, wherein the first switch comprises an N-channel metal oxide semiconductor (NMOS), wherein the second switch comprises a P-channel metal oxide semiconductor (PMOS), wherein a gate of the NMOS comprises the first switch control end, wherein a gate of the PMOS comprises the second switch control end, wherein the first control signal and the second control signal comprise a voltage signal, wherein the first switch first end of is coupled to the first switch second end, wherein the second switch first end is decoupled from the second switch second end when the voltage signal comprises a high potential, wherein the second switch first end is coupled to the second switch second end, and wherein the first switch first end is decoupled from the first switch second end when the voltage signal comprises a low potential.

5. The electronic device of claim 1, wherein the first switch comprises a first transmission gate (TG), wherein the second switch comprises a second TG, wherein a positive control end of the first TG comprises the first switch control end, wherein a negative control end of the second comprises the second switch control end, wherein the first control signal and the second control signal comprise a voltage signal, wherein the first switch first end is coupled to the first switch second end, wherein the second switch first end is decoupled from the second switch second end when the voltage signal comprises a high potential, wherein the second switch first end is coupled to the second switch second end, and wherein the first switch first end is decoupled from the first switch second end when the voltage signal comprises a low potential.

6. The electronic device of claim 1, wherein the first switch comprises a first transmission gate (TG), wherein the second switch comprises a second TG, wherein a negative control end of the first TG comprises the first switch control end, wherein a positive control end of the second TG comprises the second switch control end, wherein the first control signal and the second control signal comprise a voltage signal, wherein the first switch first end is coupled to the first switch second end, wherein the second switch first end is decoupled from the second switch second end when the voltage signal comprises a low potential, wherein the second switch first end is coupled to the second switch second end and wherein the first switch first end is decoupled from the first switch second end when the voltage signal comprises a high potential.

7. A signal processing circuit, comprising:
    at least one circuit group, the at least one circuit group comprising N circuits, N being a natural number greater than zero, second ends of all circuits in the at least one circuit group being coupled to form an output end of the at least one circuit group, first control ends of all circuits in the at least one circuit group being coupled to form a first control end of the at least one circuit group, second control ends of all circuits in the at least one circuit group being coupled to form a second control end of the at least one circuit group, and each of the N circuits comprising:
        a resistive random access memory (RRAM), a first end of the RRAM comprising a first end of the circuit, a second end of the RRAM being separately coupled to a first end of a first switch and a first end of a second switch;

the first switch, a second end of the first switch comprising a second end of the circuit, the first switch comprising a first control end, the first control end of the first switch being configured to receive a first control signal; and the second switch, a second end of the second switch comprising a third end of the circuit, the second switch comprising a second control end, the second control end of the second switch being configured to receive a second control signal, the first control signal and the second control signal simultaneously closing the first switch and opening the second switch, an absolute difference of an input potential at the first end of the circuit and an input potential at the third end of the circuit being greater than a threshold voltage of the RRAM, an absolute difference between the input potential at the first end of the circuit and an input potential at the second end of the circuit being less than the threshold voltage of the RRAM, and the threshold voltage of the RRAM being greater than zero volts; and a processor coupled to the at least one circuit group, the output end of the at least one circuit group, the first control end of the at least one circuit group, and the second control end of the at least one circuit group all being coupled to the processor, and the processor being configured to couple a first end of each circuit in the at least one circuit group to a second end of the same circuit in the at least one circuit group using the first control end of the at least one circuit group.

8. A signal processing circuit, comprising:

at least one circuit group, the at least one circuit group comprising N circuits, N being a natural number greater than zero, second ends of all circuits in the at least one circuit group being coupled to form an output end of the at least one circuit group, first control ends of all circuits in the at least one circuit group being coupled to form a first control end of the at least one circuit group, second control ends of all circuits in the at least one circuit group being coupled to form a second control end of the at least one circuit group, and each of the N circuits comprising:

a resistive random access memory (RRAM), a first end of the RRAM comprising a first end of the circuit, a second end of the RRAM being separately coupled to a first end of a first switch and a first end of a second switch;

the first switch, a second end of the first switch comprising a second end of the circuit, the first switch comprising a first control end, the first control end of the first switch being configured to receive a first control signal; and the second switch, a second end of the second switch comprising a third end of the circuit, the second switch comprising a second control end, the second control end of the second switch being configured to receive a second control signal, the first control signal and the second control signal simultaneously closing the first switch and opening the second switch, an absolute difference of an input potential at the first end of the circuit and an input potential at the third end of the circuit being greater than a threshold voltage of the RRAM, an absolute difference between the input potential at the first end of the circuit and an input potential at the second end of the circuit being less than the threshold voltage of the RRAM, and the threshold voltage of the RRAM being greater than zero volts; and a processor coupled to the at least one circuit group, the output end of the at least one circuit group, the first control end of the at least one circuit group, and the second control end of the at least one circuit group all being coupled to the processor, and the processor being configured to couple the first end of each circuit in the at least one circuit group to a third end of the same circuit in the at least one circuit group using the second control end of the at least one circuit group.

9. An electronic device comprising:

a circuit comprising:
  a resistive random access memory (RRAM) comprising:
    an RRAM first end comprising a circuit first end, and
    an RRAM second end;
  a first switch comprising:
    a first switch first end coupled to the RRAM second end,
    a first switch second end comprising a circuit second end, wherein a first absolute difference between a first input potential at the circuit first end and a second input potential at the circuit second end is less than an RRAM threshold voltage, and wherein the RRAM threshold voltage is greater than zero volts, and
    a first switch control end configured to receive a first control signal; and
  a second switch comprising:
    a second switch first end coupled to the R RAM second end,
    a second switch second end decoupled from the first switch second end and comprising a circuit third end, wherein a second absolute difference of the first input potential and a third input potential at the circuit third end is greater than the RRAM threshold voltage, and
    a second switch control end configured to receive a second control signal, wherein the first control signal and the second control signal simultaneously open the first switch and close the second switch; and a processor coupled to the circuit and configured to switch the RRAM between a resistance-variability state and a resistance-invariability state.

10. The electronic device of claim 9, wherein a resistance of the RRAM changes when the first switch is open and the second switch is closed.

11. The electronic device of claim 1, wherein both the first switch and the second switch comprise N-channel metal oxide semiconductors (NMOS).

12. The electronic device of claim 1, wherein both the first switch and the second switch comprise P-channel metal oxide semiconductors (PMOS).

13. The circuit of claim 7, wherein the first switch of each of the N circuits comprises an N-channel metal oxide semiconductor (NMOS), and the second switch of each of the N circuits comprising a P-channel metal oxide semiconductor (PMOS).

14. The circuit of claim 7, wherein the first switch of each of the N circuits comprises a P-channel metal oxide semiconductor (PMOS), and the second switch of each of the N circuits comprising an N-channel metal oxide semiconductor (NMOS).

15. The circuit of claim 7, wherein both the first switch of each of the N circuits and the second switch of each of the N circuits comprise N-channel metal oxide semiconductors (NMOS).

16. The circuit of claim 7, wherein both the first switch of each of the N circuits and the second switch of each of the N circuits comprise P-channel metal oxide semiconductor (PMOS).

17. The circuit of claim 8, wherein the first switch of each of the N circuits comprises an N-channel metal oxide semiconductor (NMOS), and the second switch of each of the N circuits comprising a P-channel metal oxide semiconductor (PMOS).

18. The circuit of claim 8, wherein the first switch of each of the N circuits comprises a P-channel metal oxide semiconductor (PMOS), and the second switch of each of the N circuits comprising an N-channel metal oxide semiconductor (NMOS).

19. The electronic device of claim 1, wherein the electronic device is independent of an inverter coupling the second switch second end to the first switch second end.

20. The electronic device of claim 9, wherein the electronic device is independent of an inverter coupling the second switch second end to the first switch second end.

* * * * *

UNITED STATES PATENT AND TRADEMARK OFFICE
CERTIFICATE OF CORRECTION

PATENT NO. : 10,586,590 B2
APPLICATION NO. : 15/822850
DATED : March 10, 2020
INVENTOR(S) : Yide Zhang et al.

It is certified that error appears in the above-identified patent and that said Letters Patent is hereby corrected as shown below:

Claim 1, Column 17, Line 41: "the R RAM" should read "the RRAM"

Claim 5, Column 18, Line 28: "the second comprises" should read "the second TG comprises"

Claim 6, Column 18, Line 51: "second end and wherein" should read "second end, and wherein"

Claim 9, Column 20, Line 33: "the R RAM" should read "the RRAM"

Signed and Sealed this
Nineteenth Day of May, 2020

Andrei Iancu
*Director of the United States Patent and Trademark Office*